(12) United States Patent
Singerl et al.

(10) Patent No.: US 8,064,856 B2
(45) Date of Patent: Nov. 22, 2011

(54) MODULATION SYSTEM AND METHOD FOR SWITCHED AMPLIFIERS

(75) Inventors: Peter Singerl, Villach (AT); Andreas Wiesbauer, Pörtschach (AT)

(73) Assignee: Infineon Technologies AG, Neubiberg (DE)

( * ) Notice: Subject to any disclaimer, the term of this patent is extended or adjusted under 35 U.S.C. 154(b) by 876 days.

(21) Appl. No.: 12/111,654

(22) Filed: Apr. 29, 2008

(65) Prior Publication Data

US 2009/0270056 A1 Oct. 29, 2009

(51) Int. Cl.
*H01Q 11/12* (2006.01)
*H04B 1/04* (2006.01)

(52) U.S. Cl. ............... 455/127.1; 455/110; 455/118

(58) Field of Classification Search ......... 455/127.3, 455/127.1, 110, 118, 127.4; 375/238
See application file for complete search history.

(56) References Cited

U.S. PATENT DOCUMENTS

| 4,357,579 A | 11/1982 | Kato et al. |
| 2006/0098762 A1 | 5/2006 | Wojtiuk |
| 2006/0281429 A1 | 12/2006 | Kishi et al. |
| 2010/0014575 A1 * | 1/2010 | Malmqvist .............. 375/238 |

FOREIGN PATENT DOCUMENTS

WO 2006050601 A1 5/2006

OTHER PUBLICATIONS

"RF and Microwave Power Amplifier and Transmitter Technologies—Part 1", Frederick H. Raab, Peter Asbeck, Steve Cripps, Peter B Kenington, Zoya B. Popovic, Nick Pothecary, John F. Sevic and Nathan O. Sokal, from May 2003 High Frequency Electronics, Summit Technical Media, LLC, 9 pgs.
"RF and Microwave Power Amplifier and Transmitter Technologies—Part 5", Frederick H. Raab, Peter Asbeck, Steve Cripps, Peter B. Kenington, Zoya B. Popovich, Nick Pothecary, John F. Sevic and Nathan O. Sokal, from Jan. 2004 High Frequency Electronics, Summit Technical Media, LLC, 6 pgs.
"The Frequency Spectrum of Pulse Width Modulated Signals", Zukui Song and Dilip V. Sarwate, Signal Processing, Jun. 2003, 39 pgs.
"RF Class-D Amplification With Bandpass Sigma-Delta Modulator Drive Signals", Thomas Johnson and Shawn P. Stapleton, IEE Transactions on Circuits and Systems—I, Regular Papers, vol. 53, No. 12, Dec. 2006, pp. 2507-2520.
"Bandpass Pulse-Width Modulation (BP-PWM)", S. Rosnell and J. Varis, IEEE, 2005, pp. 731-734.
"Radio Frequency Pulsewidth Modulation", Frederick H. Raab, IEEE Transactions on Communications, Aug. 1973, pp. 958-966.

* cited by examiner

*Primary Examiner* — Christian Hannon
(74) *Attorney, Agent, or Firm* — Eschweiler & Associates, LLC (57) ABSTRACT

A power amplifier includes a baseband modulator configured to receive a baseband amplitude component and generate a baseband modulated pulse string, an oscillator configured to receive a baseband phase component and generate phase modulated complex carrier signals, a complex up-converter configured to receive and mix the baseband modulated pulse string with the phase modulated complex carrier signals into mixed product signals, and two or more switched mode power amplifiers coupled to the complex up-converter, configured to amplify and switch the mixed product signals at the carrier frequency. The power amplifier further comprises complex filters individually coupled to one of the switch mode power amplifiers, configured to suppress image components in the amplified and switched mixed product signals, and a power combiner coupled to the two or more complex filters, configured to combine the real component of the complex filtered and amplified mixed product signals to generate an RF transmission signal.

25 Claims, 8 Drawing Sheets

MODULATION SYSTEM AND METHOD FOR SWITCHED AMPLIFIERS

BACKGROUND

Bandwidth-efficient modulation methods with a non-constant envelope are used in base stations of the third and higher generations. It is precisely this fluctuation that leads to the need to operate "quasi-linear" high-frequency power amplifiers with a large back-off operating point in order to meet the high linearity requirements that are usually specified by a standard. Utilizing this operating mode, however, leads to poor efficiency, which is reflected strongly in the production and operation costs of the base station.

There are a number of measures that can be used to improve efficiency under a given set of linearity requirements. This can be achieved by special HF power amplifier architectures, using improved transistor technologies, and by special linearization circuits (which can be realized both in the high-frequency range and in the digital baseband). The overall efficiency, which can be achieved by these state-of-the-art methods, however, is still only about 30%. Accordingly, there is a continued need to improve the efficiency of base station power amplifier and modulation systems.

SUMMARY

The following presents a simplified summary in order to provide a basic understanding of one or more aspects of the disclosure. This summary is not an extensive overview, and is neither intended to identify key or critical elements of the disclosure, nor to delineate the scope thereof. Rather, the primary purpose of the summary is to present some concepts in a simplified form as a prelude to the more detailed description that is presented later.

In one embodiment, a power amplifier is disclosed, having a baseband modulator configured to receive a baseband amplitude component and generate a baseband modulated pulse string. The power amplifier also includes an oscillator configured to receive a baseband phase component and generate phase modulated complex carrier signals, a complex up-converter configured to receive and mix the baseband modulated pulse string with the phase modulated complex carrier signals into mixed product signals, and two or more switched mode power amplifiers coupled to the complex up-converter, configured to amplify and switch the mixed product signals at a carrier frequency encoded within the mixed product signals. The power amplifier further includes two or more complex filters individually coupled to one of the switch mode power amplifiers, configured to suppress image components in the amplified and switched mixed product signals, and a power combiner coupled to the two or more complex filters, configured to combine the real component of the complex filtered and amplified and switched mixed product signals to generate an RF transmission signal.

In one embodiment, a method is disclosed for efficiently amplifying and modulating a complex carrier signal for a base station while suppressing image components in the desired RF frequency range employing baseband modulation. The method includes receiving a baseband amplitude component and generating a baseband modulated pulse string and receiving a baseband phase component and generating a phase modulated complex carrier signal. The method also comprises up-converting the baseband modulated pulse string with the phase modulated complex carrier signal thereby generating a mixed product signal, and switching and amplifying the mixed product signal at a carrier frequency encoded within the mixed product signal. Finally, the method further includes complex filtering to suppress image components in the amplified and switched mixed product signal and combining the real component of the complex filtered and amplified and switched mixed product signal to generate an RF transmission signal.

The following description and annexed drawings set forth in detail certain illustrative aspects and implementations. These are indicative of only a few of the various ways in which the disclosed principles may be employed.

DETAILED DESCRIPTION

One or more implementations will now be described with reference to the attached drawings, wherein like reference numerals are used to refer to like elements throughout. Systems and methods are disclosed for efficiently amplifying and modulating a complex carrier signal for a base station while suppressing image components in the desired RF frequency range employing, for example, a baseband modulator, a complex up-converter, switched mode amplifiers, complex filtering and power combining.

Because the overall efficiency achievable by conventional RF power amplification methods is still quite low (e.g., about 30%), there is a continued need to improve the efficiency of base station RF power amplifier and modulation systems. This efficiency can be significantly improved (e.g., to approximately 60%) according to one embodiment by using switched amplifiers such as class F, inverse class F, class D, etc., instead of the "quasi-linear" (e.g., AB mode) high-frequency power amplifiers. Because current and voltage generally do not occur simultaneously in ideal switches, much higher efficiencies can thus be obtained. When these types of switched amplifiers are used for applications with bandwidth-efficient modulation methods (e.g., UMTS base stations), special circuits (modulators) are disclosed which code both the time-dependent phase and the time-dependent envelope (amplitude) of the carrier frequency in the time domain to drive these switched amplifiers, so that the original high-frequency transmission signal can be recovered by the simplest possible demodulation means, for example, by using bandpass filters (BPF).

In accordance with the disclosure, the coding of the time-dependent phase and coding of the envelope (amplitude) are carried out in the baseband by contrast to the conventional bandpass modulation methods. The baseband modulation technique may be accomplished, for example, by delta-sigma or by pulse-width modulators. One advantage of utilizing pulse-width modulators is that the spectrum is concentrated exclusively around multiples of the PWM reference frequency, providing gaps in the spectrum which can be used advantageously to achieve the required signal-to-noise ratio in the high-frequency range. One advantage of baseband modulation is that the switching frequency can be reduced in comparison to that of the bandpass modulation technique. This lower switching frequency translates to a higher potential efficiency for the bandpass modulation technique, and the spectral components are concentrated more strongly around the carrier, which generally translates to a narrower amplifier bandwidth requirement.

Accordingly, a complex baseband modulation method for switched amplifiers is provided in one embodiment to provide a high efficiency power amplifier suitable for base stations and other applications that could use such baseband modulated switch-mode power amplifiers. Advantages over previous power amplifier implementations are thereby provided including high efficiency, power and cost savings.

Figure 1A:
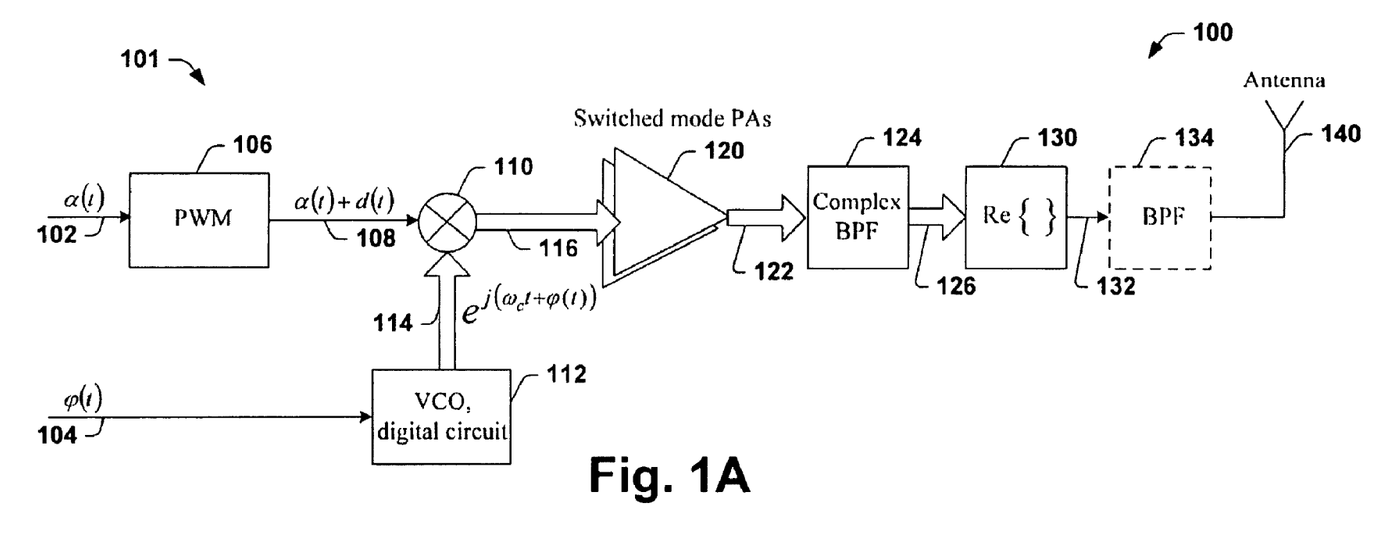
FIG. 1A is a simplified schematic diagram of a power amplifier for a base station utilizing a switched amplifier concept having complex filtering and power combining in accordance with one embodiment of the disclosure.

Turning now to FIG. 1A, a simplified schematic diagram of a base station switch-mode power amplifier system 100 utilizing baseband modulation and a switched amplifier concept having complex filtering and power combining is illustrated in one embodiment of the disclosure. In one embodiment, the power amplifier system 100 comprises a drive 101, including a baseband modulator 106 (e.g., a pulse width modulator (PWM) or a delta-sigma modulator), a complex up-converter 110 of a complex design, for example, comprising one or more IQ mixers and a drive circuit (not explicitly shown in FIG. 1A), and an oscillator 112 (e.g., a VCO or another digital circuit). The power amplifier 100 further comprises one or more switched mode power amplifiers 120, two or more complex filters 124 (e.g., complex bandpass filters (BPF)) and a power combiner 130. The power amplifier 100 may also include an RF filter 134 such as a bandpass filter (BPF) and an antenna 140 to transmit an RF signal.

In operation, the power amplifier 100 is configured to receive a baseband amplitude component α(t) 102 at the pulse width modulator (PWM) 106 of drive circuit 101 and generate a baseband modulated pulse string 108 corresponding to a time range a(t)+d(t). The power amplifier 100 also receives a baseband phase component φ(t) 104 at the input to oscillator 112. The oscillator 112 is configured to receive the baseband phase component φ(t) 104 and generate phase modulated complex carrier frequency signals $e^{j(\omega_c t+\phi(t))}$ 114. The complex up-converter 110 is configured to receive and mix the baseband modulated pulse string 108 (corresponding to a time range a(t)+d(t)), with the phase modulated complex carrier signals $e^{j(\omega_c t+\phi(t))}$ 114 into mixed product signals 116.

The complex up-converter 110 has a complex design, for example, using IQ mixers so as to minimize the undesirable image components caused by the wide bandwidth of the PWM output signal within the signal band around the carrier frequency $\pm\omega_c$ corresponding to the standard requirements.

The two or more switched mode power amplifiers 120 coupled to the complex up-converter 110, are configured to receive, amplify and switch these mixed product signals 116 at a carrier frequency encoded within the mixed product signals 116. In particular, the real output signals (of the mixed product signals) 116 of the up-converter 110 in FIG. 1A, which are bursts, each with 90° phase-shifted RF oscillations (with respect to one another), are amplified by the two or more switched mode power amplifiers 120, to the required output power. The two or more complex filters 124 are individually coupled to one of the switch mode power amplifiers 120, and are configured to suppress image components in the amplified mixed product signals 122 generated at the output of the power amplifiers 120.

The power combiner (Re{ } operation) 130 (e.g., coupler or another appropriate power combiner), is coupled to the two or more complex filters 124, and is configured to combine the real components of the complex filtered and amplified mixed product signals 126 from the output of the two or more complex filters 124 to generate an RF transmission signal 132. Thereafter, the RF transmission signal 132 may be further bandpass filtered by BPF 134 to conform to the required spectral masks (as dictated by the chosen communications standard, such as UMTS, GSM, etc.) and transmitted via the antenna 140.

While the power amplifier system 100 will be described herein with identified PWM, VCO, complex up-converter or mixers, switched mode power amplifiers (SPA), complex filters, a combiner, and band-pass filters (BPF) as one example, it should be understood that many variations of such components and features can be made, and all such variations are contemplated as falling within the scope of the disclosure. Image suppression can also be carried out by other means also contemplated within the scope of the disclosure.

Figure 1B:
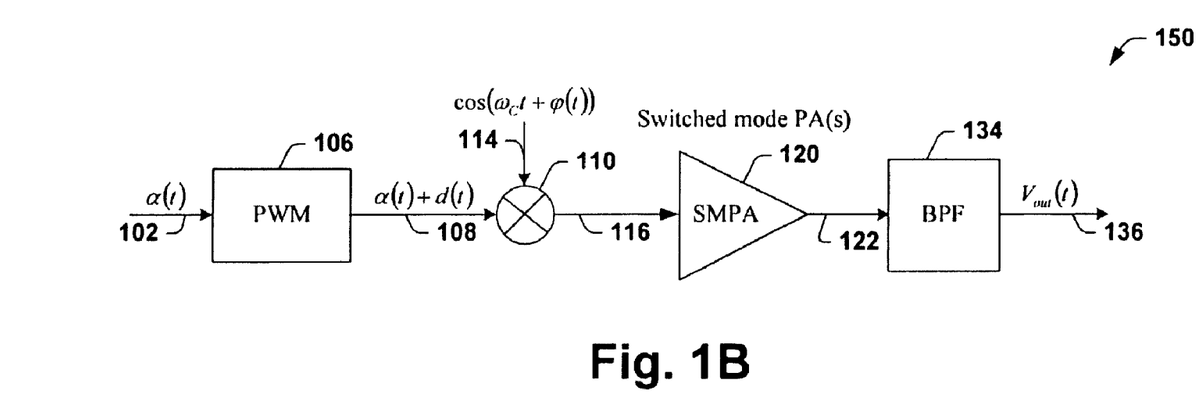
FIG. 1B is a simplified schematic diagram of a baseband modulator, a real up-converter, and a switched amplifier such as may be used in the power amplifier of FIG. 1A, in accordance with one embodiment of the disclosure.

FIG. 1B illustrates one embodiment of a switched mode power amplifier system 150 comprising a baseband modulator 106 (e.g., PWM or a delta-sigma modulator), a real up-converter 110 and a switched amplifier 120, such as may be used in the power amplifier system 100 of FIG. 1A, in accordance with the disclosure.

The starting point of understanding the power amplifier systems 100 and 150 of FIGS. 1A and 1B, respectively, and for our considerations of the baseband modulation technique, is a high-frequency signal which is both amplitude-modulated and phase-modulated and which can be written in the following form:

$$x(t)=a(t)\cos(\omega_c t+\phi(t))  \qquad 1)$$

This signal form, however, may not be suitable for a switched amplifier because of the fluctuating envelope a(t). When this envelope is coded with a pulse-width modulator (e.g., PWM 106), we obtain a square-wave output signal of constant frequency (depending on the PWM reference frequency), the pulse width of which increases in linear fashion with the amplitude of the envelope. The PWM frequency must be selected in accordance with the bandwidth of the envelope and the requirements on the signal-to-noise ratio. The time range 108 of the output signal of the PWM modulator 106 in FIG. 1A is a(t)+d(t). To shift this spectrum into the bandpass position of the carrier frequency (see FIG. 1B), the square-wave output signal 108 of the PWM 106 is multiplied (purely mathematically, wherein the implementation does not require a multiplier) by the phase-modulated carrier (cos ($\omega_c$t+ϕ(t)) 114, which is generated by, for example, a voltage-controlled oscillator (VCO) or by a digital circuit such as VCO/digital circuit 112 of FIG. 1A. After this operation, we obtain bursts 116 at the output of the mixer 110 having phase-modulated RF oscillations, by means of which the switched amplifier 120 can be operated efficiently in, for example, a class-D operating mode.

Figure 2:
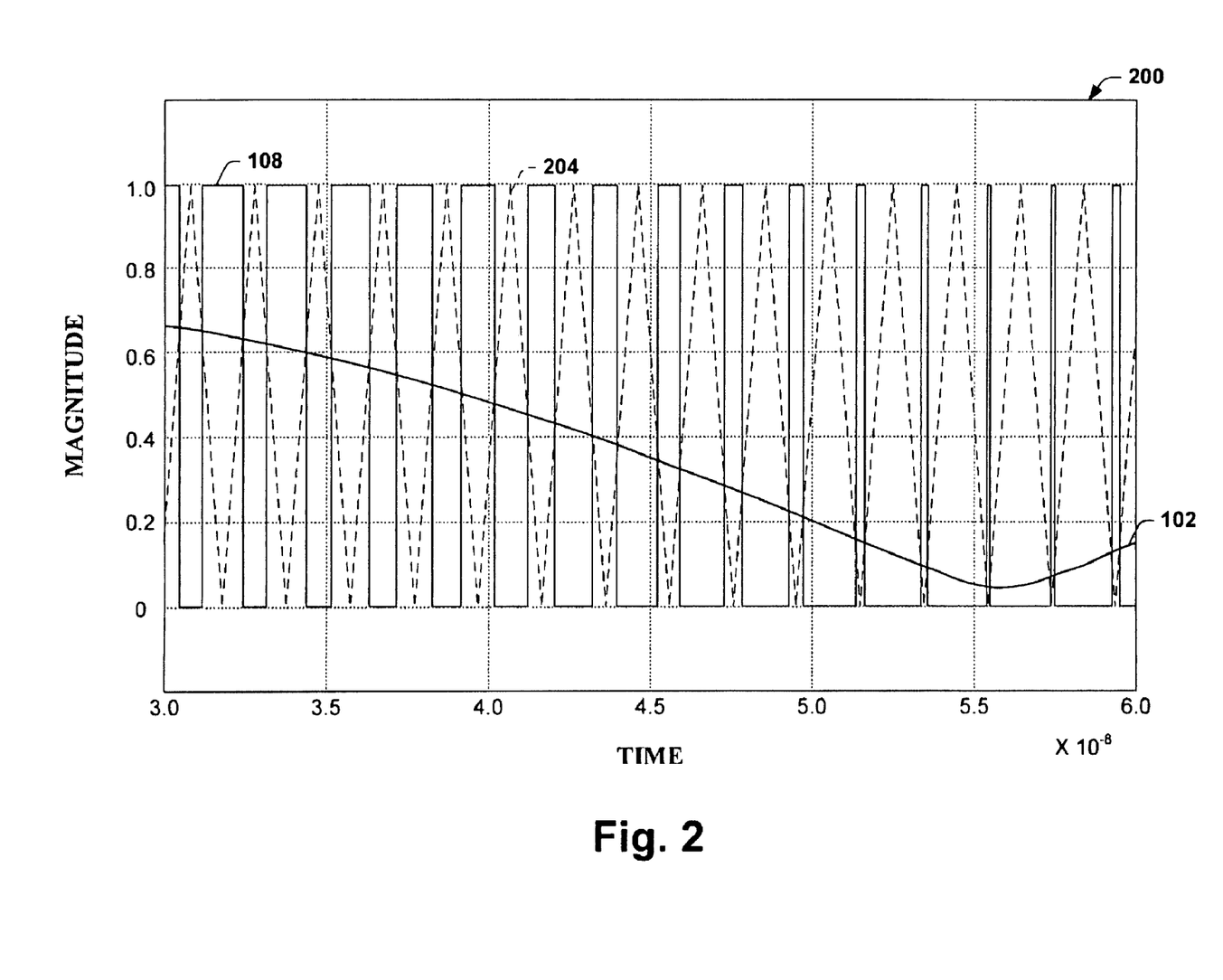
FIG. 2 is a plot of the baseband frequency signals of a pulse width modulator (PWM) such as may be used in the power amplifier of FIG. 1A, in one embodiment.

FIG. 2 illustrates a plot 200 of the baseband time-range signals of a pulse width modulator (e.g., PWM 106) such as may be used in the power amplifier systems 100 and 150 of FIGS. 1A and 1B, respectively, in one embodiment. In particular, FIG. 2 illustrates a short section of the envelope 102 or the amplitude component a(t) 102 from FIGS. 1A and 1B, and the associated PWM output signal 108 (time range a(t)+d(t)) after modulation in PWM 106 by a reference signal 204 (e.g., by a triangle waveform).

Figure 3:
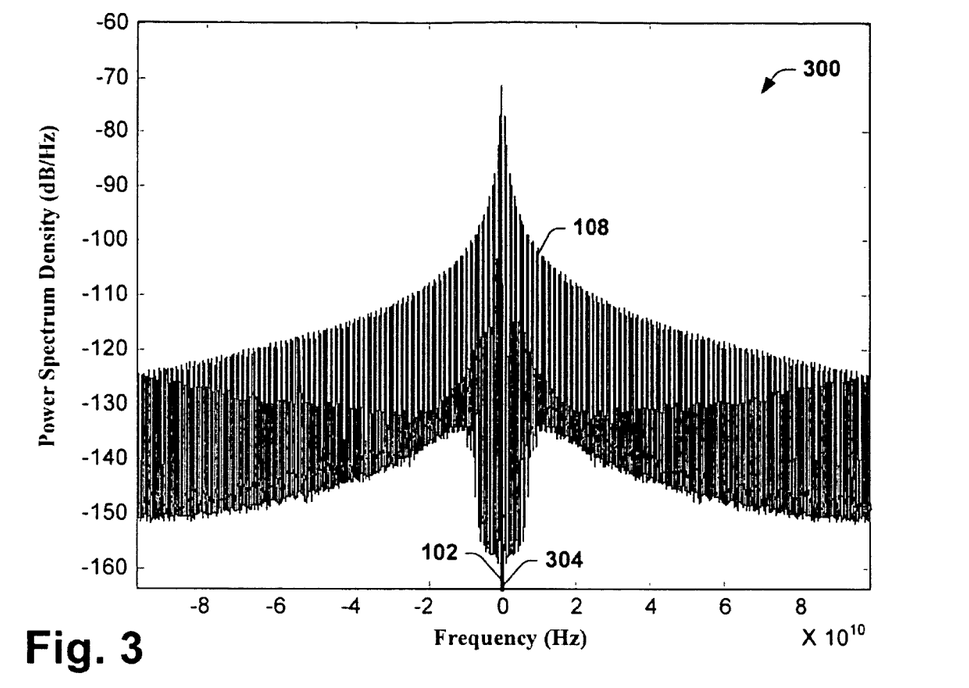
FIGS. 3 and 4 are plots of the baseband time-range signals of the pulse width modulator such as may be used in the power amplifier of FIG. 1A, in one embodiment.
Figure 4:
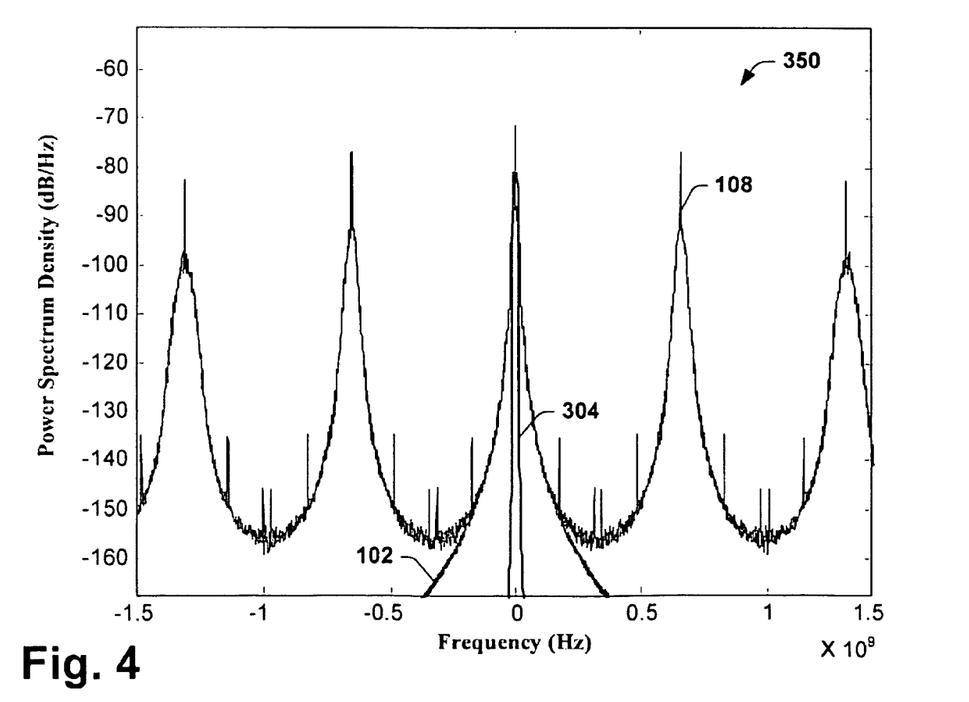

FIGS. 3 and 4 illustrate plots 300 and 350, respectively, of the baseband frequency signals of the pulse width modulator (e.g., PWM 106) such as may be used in the power amplifier of FIG. 1A, in one embodiment. In particular, plot 350 of FIG. 4 is a blow-up of one key portion of plot 300 of FIG. 3 that illustrates the envelope 102, a baseband signal 304, and the spectrum of the PWM output signal 108, where the energy of the PWM signal 108 is concentrated around the multiples of the PWM frequency (in this example, approximately 650 MHz).

Because the PWM output signal usually has a bandwidth which is much greater than the carrier frequency, the spectral components of the baseband spectrum in FIG. 3 overlap after up-shifting to the carrier frequency (baseband spectrum is shifted by the multiplication in the time range of ±fc in the frequency range). If the PWM frequency is adjusted by means of the following relationship:

$$f_{PWM}\left[n - \frac{1}{2}\right] = 2f_c \qquad 2)$$

where n is a whole number, the signal-to-noise ratio (SNR) of the desired signal can be maximized, wherein the desired signal comprises the complex baseband signal a(t)$e^{j\Phi t}$ on the carrier frequency and the noise caused by the image frequencies. The achievable SNR value, however, depends strongly on the PWM frequency. The reason for this is that the spectral components which are concentrated around the multiples of the PWM frequency become progressively wider as the frequency increases and thus merge into each other more and more, so that there are no longer any energy gaps in a certain frequency interval.

Figure 5:
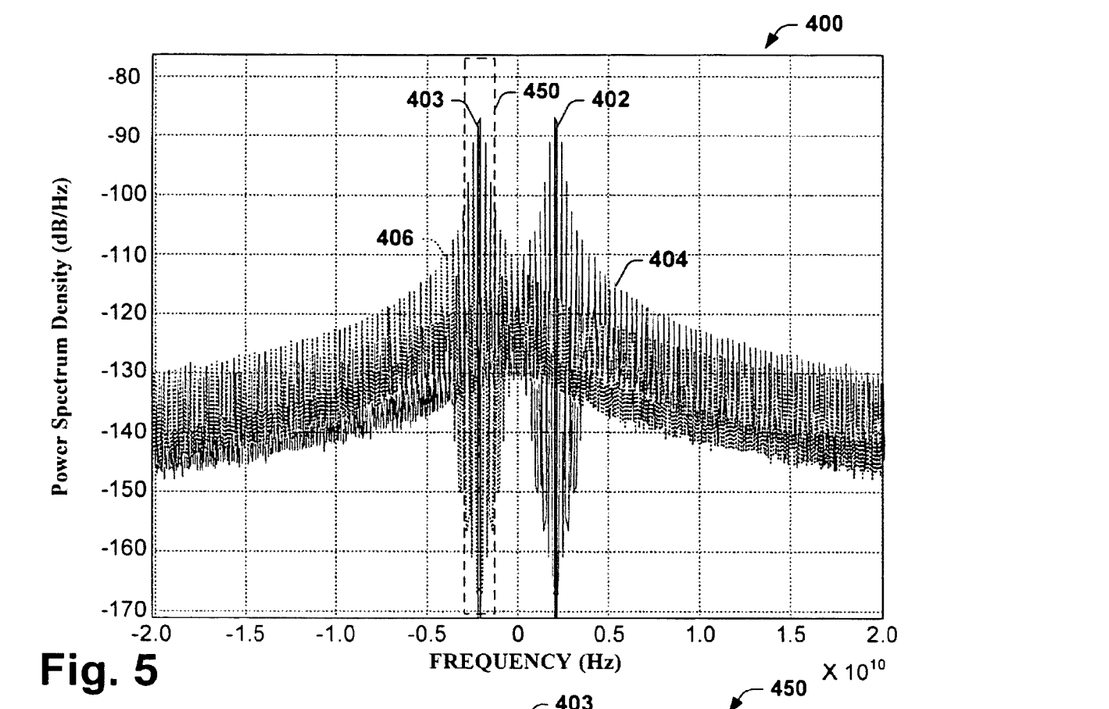
FIGS. 5 and 6 are plots of the high-frequency spectra after mixing onto the high-frequency carrier such as after the mixer in the power amplifier of FIG. 1A, in one embodiment.
Figure 6:
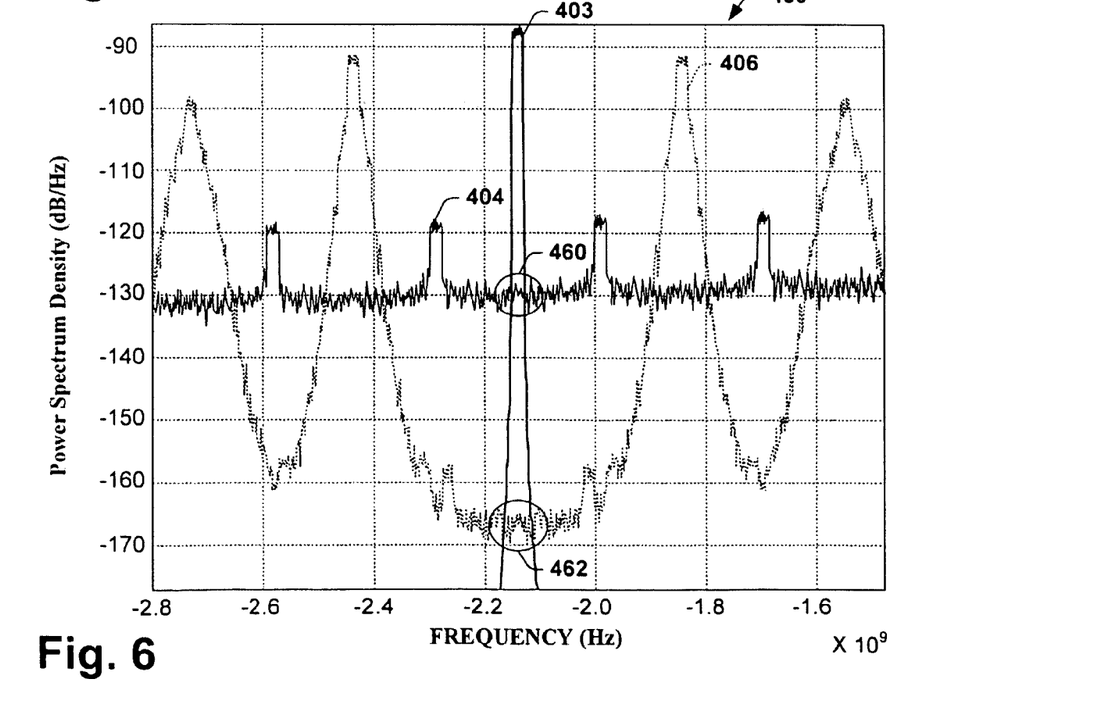

FIGS. 5 and 6 illustrate plots 400 and 450, respectively, of the high-frequency spectra after mixing onto the high-frequency carrier (e.g., at $f_{PWM}$~290 MHz) such as after the complex up-converter or mixer 110 in the power amplifier system 100 of FIG. 1A, in one embodiment. In particular, plot 450 of FIG. 6 is a blow-up of one key portion of plot 400 of FIG. 5 illustrating the original RF phase component signal 402 (which is also the desired signal), the positive complex carrier frequency signal z(t)$e^{+j(\omega_c t+\phi(t))}$ 404 (e.g., the baseband shifted +2.3 GHz), the negative complex carrier frequency signal z(t)$e^{-j(\omega_c t+\phi(t))}$ 406 (e.g., the baseband shifted −2.3 GHz), unwanted image components 460 and 462.

In contrast to the 500 MHz PWM frequency example discussed in FIGS. 3 and 4, if a lower PWM frequency is selected, for example, 295 MHz, as shown in FIGS. 5 and 6, the spectral energy gaps will merge together, which lowers the SNR correspondingly to approximately 43 dB. FIGS. 5 and 6 illustrate this effect where the positive and negative complex carrier frequency spectra overlap in the area of the unwanted image components 460 and 462 illustrated more particularly in FIG. 6.

Figure 7:
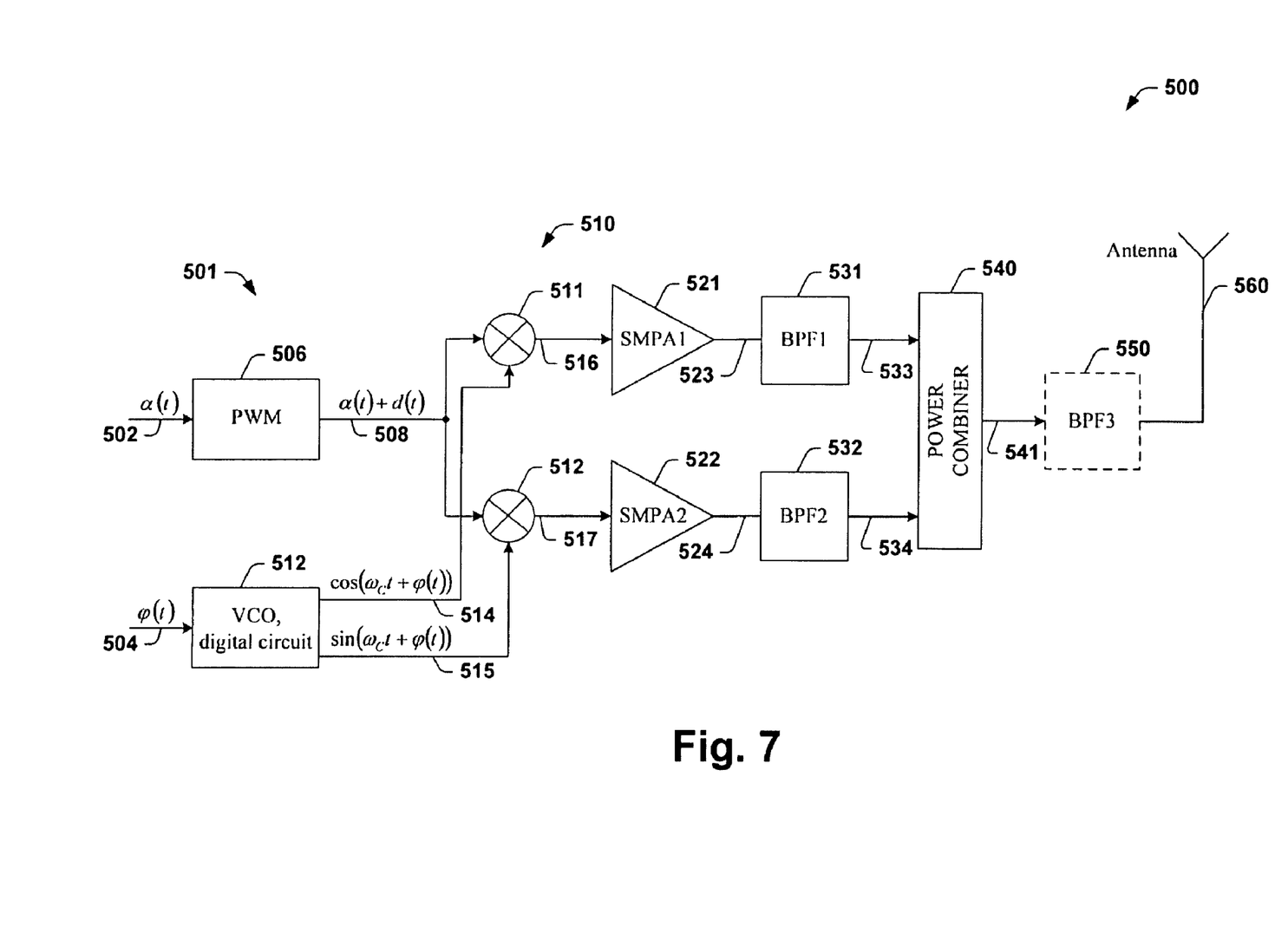
FIG. 7 is a simplified schematic diagram of a power amplifier using a baseband modulator and a switched amplifier such as may be used in accordance with one embodiment of the disclosure.

To reduce the PWM frequency under a given set of SNR requirements, the image components 460 and 462 shown in FIGS. 5 and 6 can be reduced appropriately by the new circuit concept illustrated in FIGS. 1A and 7 and as described infra.

FIG. 7 illustrates a simplified schematic diagram of a power amplifier system 500 utilizing a baseband modulator and a switched amplifier such as may be used in one embodiment. FIG. 7 shows a block circuit diagram of the switched amplifier concept of FIG. 1A with real circuit blocks.

Similar to the power amplifier system 100 of FIG. 1A, in one embodiment, the power amplifier system 500 of FIG. 7 comprises a drive 501, including a baseband modulator 506 (e.g., a pulse width modulator (PWM) or a delta-sigma modulator), a complex up-converter 510 of a complex design, for example, comprising one or more IQ mixers 511/512 and a drive circuit (not explicitly shown in FIG. 7). The system 500 further comprises an oscillator 512 (e.g., a VCO or another digital circuit), one or more switched mode power amplifiers SMPA1 (521) and SMPA2 (522), two or more complex filters BPF1 531 and BPF2 532 (e.g., complex bandpass filters (BPF)) and a power combiner 540. The power amplifier system 500 may also include an RF filter 550 such as an RF bandpass filter BPF3 550 and an antenna 560 to transmit an RF signal.

The power amplifier system 500 is configured to receive a (baseband) amplitude component α(t) 502 at the pulse width modulator (PWM) 106 of drive circuit 501 and generate a baseband modulated pulse string 508 corresponding to a time range a(t)+d(t), and also configured to receive a (baseband) phase component ϕ(t) 504 at the input to oscillator 512. The PWM output signal a(t)+d(t) 508 of power amplifier system 500 is multiplied by the complex carrier exp(j($\omega_c$t+ϕ(t)))=cos ($\omega_c$t+ϕ(t))+j sin($\omega_c$t+ϕ(t)), comprising complex carrier frequency component (cos($\omega_c$t+ϕ(t)) 514 and complex carrier frequency component (sin($\omega_c$t+ϕ(t)) 515, and is divided in FIG. 7 into real and imaginary parts before the RF bursts are amplified to the required power levels with 90° phase-shifted and phase-modulated carriers in each case in the two or more switched amplifiers (SMPA1 and SMPA2). Again, the multipliers (e.g., mixers 511/512) do not have to be designed technically as such, because the input signals to the multipliers (output signal 508 of the PWM 506) merely turns the complex carrier frequency output signals 514/515 from the VCO 512 on or off, which corresponds to multiplication by +1 or 0.

The complex up-converter 510 is configured to receive and mix the baseband modulated pulse string 508 (corresponding to a time range a(t)+d(t)), with the phase modulated complex carrier signals exp(j($\omega_c$t+ϕ(t)) 514/515 into mixed product signals 516/517. Here again, the complex up-converter 510 has a complex design, for example, using IQ mixers 511/512 so as to minimize the undesirable image components caused by the wide bandwidth of the PWM output signal 508 within the signal band around the carrier frequency ±$\omega_c$ corresponding to the standard requirements.

The two or more switched mode power amplifiers SMPA1 521 and SMPA2 522 coupled to the complex up-converter 510, are configured to receive, amplify and switch these mixed product signals 516/517 at a carrier frequency encoded within the mixed product signals 516/517. In particular, the real output signals of the mixed product signals 516/517 of the up-converter 510, comprising bursts of 90° phase-shifted RF oscillations, are amplified by the two or more switched mode power amplifiers SMPA1 and SMPA2, to the required output power. The two or more complex filters 531/532 are individually coupled to one of the switch mode power amplifiers SMPA1 and SMPA2 521/522, and are configured to suppress image components in the amplified mixed product signals 523/524 generated at the output of the power amplifiers SMPA1 521 and SMPA2 522.

As in FIG. 1A, the power combiner (Re{ } operation) 540 (e.g., coupler or another appropriate power combiner) of the power amplifier system 500 of FIG. 7, is coupled to the two or more complex filters 531/532, and is configured to combine the real components of the complex filtered and amplified mixed product signals 533/534 from the output of the two or more complex filters 531/532 to generate an RF transmission signal 541. Thereafter, the RF transmission signal 541 may be further bandpass filtered by RF filter BPF3 (550) to conform to one or more required spectral masks (as dictated by the chosen communications standard, such as UMTS, GSM, etc.) and transmitted via the antenna 560.

Although single bandpass filters are shown in FIG. 7, filters BPF1 531, BPF2 532, or RF filter BPF3 550 may individually comprise one or more filters. Similarly, although single switched mode amplifiers are shown in FIG. 7, amplifiers SMPA1 521 and SMPA2 522 may individually comprise one or more amplifiers, switches, or another suitable RF switching circuit, for example, and as such are contemplated within the scope of the disclosure.

Figure 8:
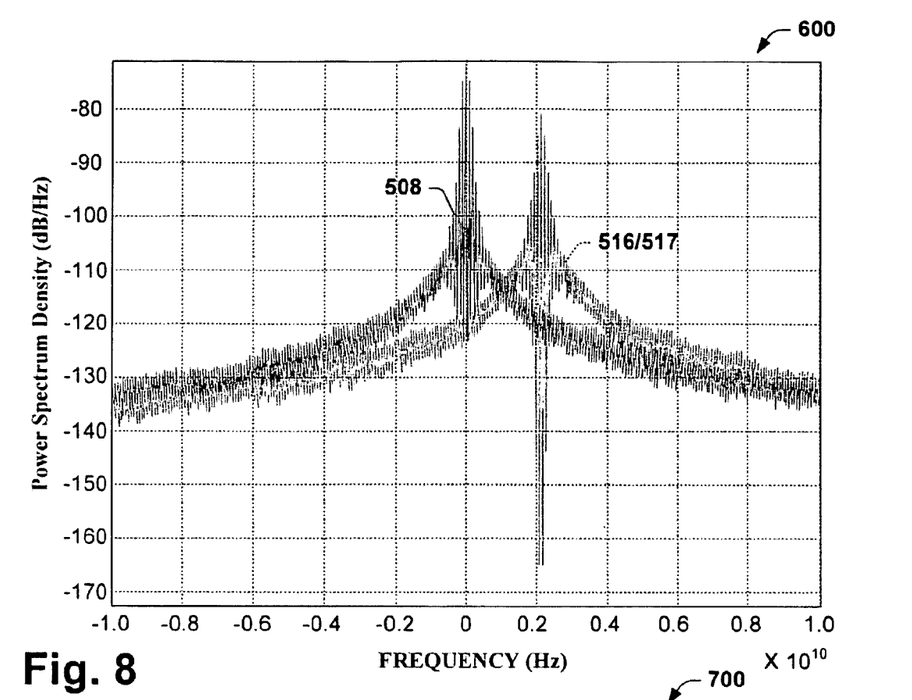
FIG. 8 is a plot of the spectra of the PWM baseband and PWM after complex up-conversion such as after the complex up-converter in the power amplifier of FIG. 7, in one embodiment.

FIG. 8 illustrates spectra 600 of the baseband spectrum of the PWM output signal 508 and the spectrum of the complex signal given by the real and imaginary time-domain signals in 516 and 517, respectively, (e.g., the frequency shifted PWM output signals 516/517 of FIG. 7) after the complex (IQ) up-converter 510 in the power amplifier system 500 of FIG. 7, in one embodiment. Before this signal, but after amplification of the original real signal in (1) by a power-combiner (e.g., power combiner 540), the spectral components must be suppressed appropriately for the negative carrier frequency.

This spectral component suppression can be performed by a complex filter, for example, using 2 different real filters such as BPF1 531 and BPF2 532 of FIG. 7.

Figure 9:
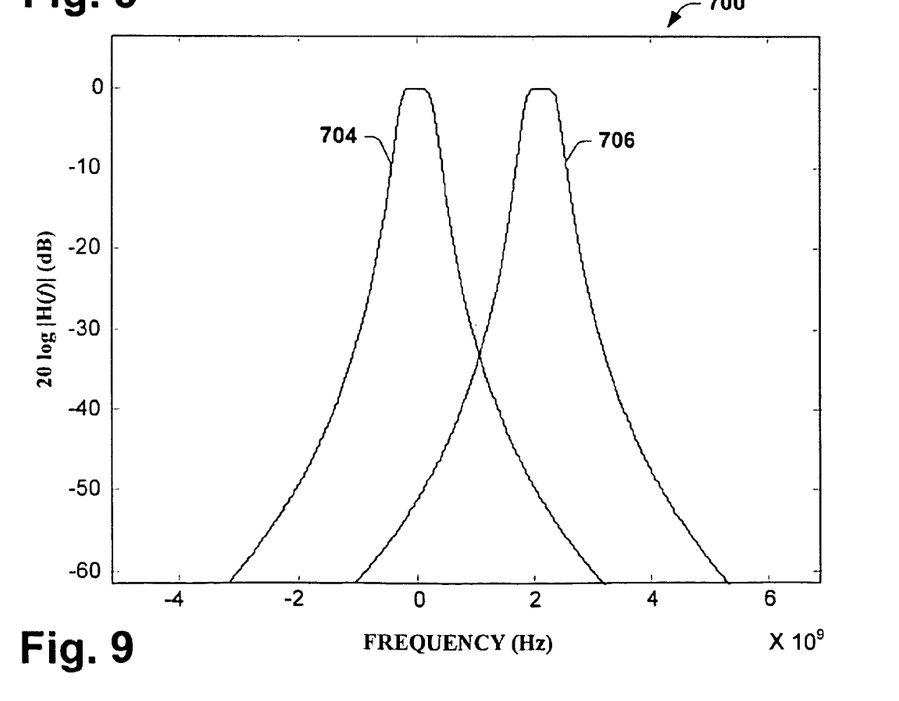
FIG. 9 is a plot of the absolute value frequency response of a real and a complex third-order bandpass filter such as the bandpass filter of FIG. 7, in one embodiment.

FIG. 9 illustrates a plot 700 of the absolute value frequency response (transfer function) of a real bandpass filter 704 and a complex third-order bandpass filter 706, such as the complex bandpass filters BPF1 531 and BPF2 532 of FIG. 7, in one embodiment.

Figure 10:
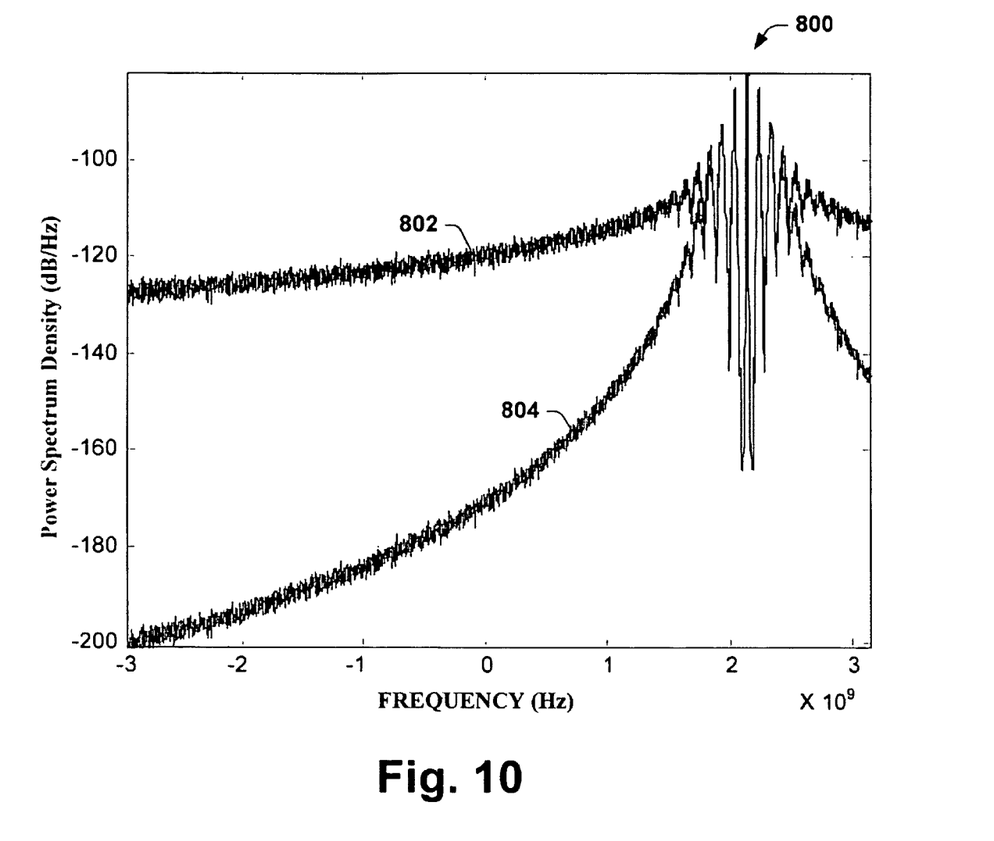
FIG. 10 is a plot of the spectra before and after filtering with the complex bandpass filter of FIG. 9, used in the power amplifier of FIG. 7, in one embodiment.

FIG. 10 illustrates a plot of the spectra 800 before filtering 802 and after filtering 804 with the complex bandpass filters (BPF1 531 and BPF2 532) of FIG. 9, used in the power amplifier 500 of FIG. 7, in one embodiment. Thus, the waveform 802 corresponds to the input signals 523/524 to the band pass filters BPF1 531 and BPF2 532, respectively, while waveform 804 corresponds to the output signals 533/534 from the band pass filters BPF1 531 and BPF2 532, respectively. Comparing waveform 804 to that of waveform 802 in FIG. 10, it can be seen that, with the BPF filter represented by the waveform 706 in FIG. 9, an image frequency reduction of approximately 70 dB at the negative carrier frequency $f_c=-2.14$ GHz may be achieved.

Figure 11:
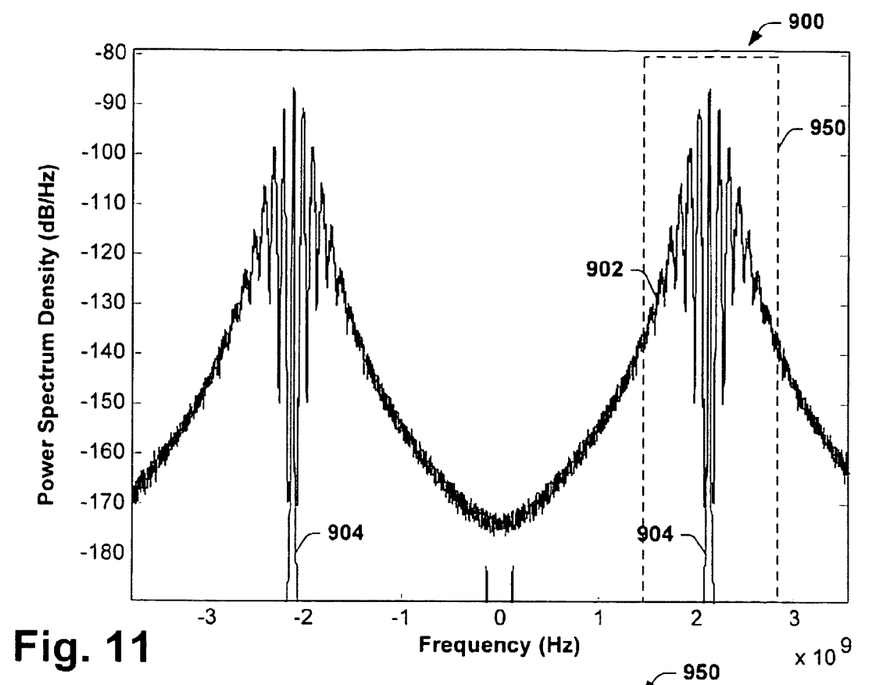
FIGS. 11 and 12 are plots of the spectrum of the desired output signal and spectrum after complex filtering and power combining such as may be seen in the power amplifier of FIG. 7, in accordance with one embodiment of the disclosure.
Figure 12:
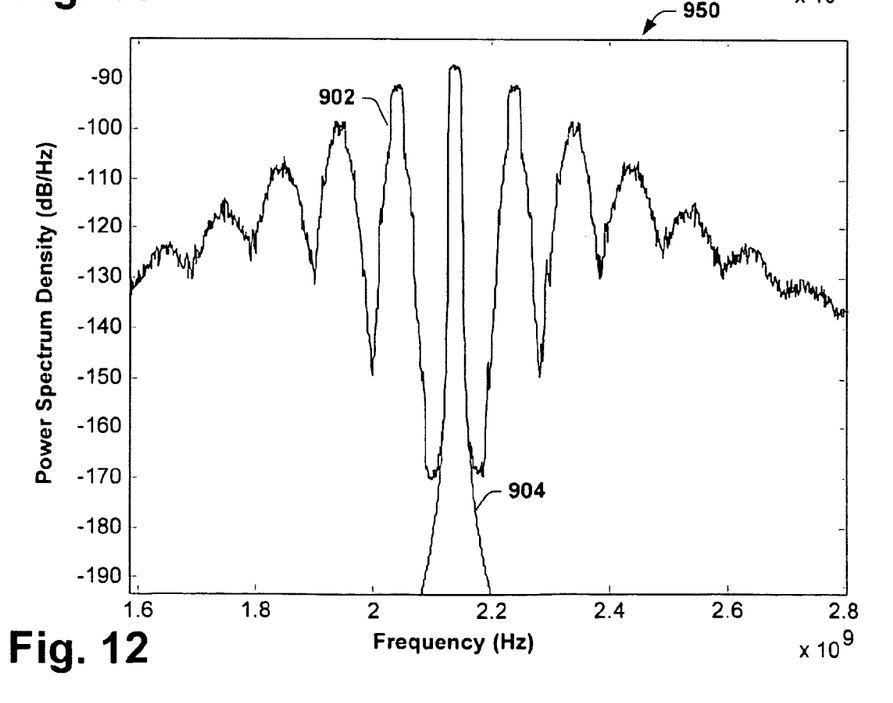

FIGS. 11 and 12 illustrate plots 900 and 950, respectively, of the spectrum of the desired output signal 904 and the spectrum after complex filtering and power combining 902, such as may be seen in the power amplifier system 500 of FIG. 7, in one embodiment. In particular, plot 950 of FIG. 12 is a blow-up of one key portion of plot 900 of FIG. 11 that illustrates these output signals 902 and 904 providing the desired high SNR of approximately 70 dB.

In addition to or in substitution of one or more of the illustrated components, the illustrated power amplifier and other systems may include suitable circuitry, state machines, firmware, software, logic, etc. to perform the various methods and functions illustrated and described herein, including but not limited to the method(s) described below.

In one embodiment, a method is disclosed for efficiently amplifying (e.g., via SMPA1 and SMPA2 of FIG. 7) and modulating (e.g., via PWM 506 of FIG. 7) a complex carrier signal 514/515 for a base station while suppressing image components (e.g., 460/462 of FIG. 6) in the desired RF frequency range employing baseband modulation, for example, using the power amplifier system 500 of FIG. 7.

The method includes receiving a baseband amplitude component (e.g., a(t) 502 of FIG. 7) and generating a baseband modulated pulse string (e.g., a(t)+d(t) 508) and receiving a baseband phase component (e.g., $\phi(t)$ 504) and generating a phase modulated complex carrier signal $\exp(j(\omega_c t+\phi(t))=\cos(\omega_c t+\phi(t))+j\sin(\omega_c t+\phi(t))$ 514/515. The method also comprises up-converting (e.g., via complex up-converter or I/Q modulator 510) the baseband modulated pulse string (508) with the phase modulated complex carrier signal (e.g., 514/515) thereby generating a mixed product signal (e.g., 516/517) and switching and amplifying (e.g., via SMPA1-521 and SMPA2-522 of FIG. 7) the mixed product signal at the carrier frequency (e.g., $\pm\omega_c$) encoded within the mixed product signal (e.g., 516/517).

Finally, the method further includes complex filtering (e.g., via BPF1-531 and BPF2-532 of FIG. 7) to suppress image components (e.g., 460/462 of FIG. 6) in the amplified mixed product signal and combining (e.g., via Power combiner 540 of FIG. 7) the real component of the complex filtered and amplified mixed product signal (e.g., 533/534) to generate an RF transmission signal (e.g., 541 or 560).

In another embodiment, the method further comprises filtering (e.g., via BPF3-550 of FIG. 7) the RF transmission signal (e.g., 541) to a required spectral mask (e.g., as dictated by the chosen communications standard, such as UMTS, GSM, etc.) and transmitted (e.g., via the antenna 560).

Although illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A power amplifier for a base station, comprising:
a baseband modulator configured to receive a baseband amplitude component and generate a baseband modulated pulse string;
an oscillator configured to receive a baseband phase component and generate phase modulated complex carrier signals;
a complex up-converter configured to receive and mix the baseband modulated pulse string with the phase modulated complex carrier signals into mixed product signals;
two or more switched mode power amplifiers coupled to the complex up-converter, configured to amplify and switch the mixed product signals at a carrier frequency encoded within the mixed product signals;
two or more complex filters individually coupled to a respective one of the switch mode power amplifiers, and configured to suppress image components in the amplified and switched mixed product signals; and
a power combiner coupled to the two or more complex filters, configured to combine a real component of the complex filtered and amplified and switched mixed product signals to generate an RF transmission signal.

2. The power amplifier of claim 1, comprising an RF bandpass filter coupled to the output of the power combiner configured to further filter the RF transmission signal to a required spectral mask.

3. The power amplifier of claim 2, comprising an antenna coupled to an output of the RF bandbass filter.

4. The power amplifier of claim 1, where the power amplifier is configured for use in a base station conforming to UMTS standards.

5. The power amplifier of claim 1, wherein the baseband modulator comprises one of a pulse width modulator and a delta-sigma modulator.

6. The power amplifier of claim 1, wherein the baseband amplitude component is associated with a time-dependent envelope of the carrier frequency.

7. The power amplifier of claim 1, wherein the baseband modulated pulse string represents a time range of the carrier frequency.

8. The power amplifier of claim 1, wherein the complex up-converter comprises an I/Q modulator.

9. The power amplifier of claim 1, wherein the two or more switched mode power amplifiers operate in a switched mode comprising one of a class-D and a class-E switch mode.

10. The power amplifier of claim 1, wherein the oscillator comprises one of a voltage controlled oscillator and a digital circuit configured to generate complex carrier signals based on the baseband phase component.

11. The power amplifier of claim 10, wherein the complex up-converter comprises first and second mixers individually coupled to the baseband modulator and the oscillator, and wherein the first mixer is coupled to a first complex carrier signal and the second mixer is coupled to a second complex carrier signal.

12. A power amplifier, comprising:
a baseband modulator configured to receive a baseband amplitude component associated with a time-dependent envelope of a carrier frequency and generate a baseband modulated pulse string representing a time range;
a voltage controlled oscillator configured to receive a baseband phase component and generate phase modulated complex carrier signals;
an I/Q modulator configured to receive and mix the baseband modulated pulse string with the phase modulated complex carrier signals into mixed product signals;
two or more switched mode power amplifiers operating in a switched mode comprising one of a class-D and a class-E switch mode, and coupled to the complex up-converter, configured to amplify and switch the mixed product signals at the carrier frequency encoded within the mixed product signals;
two or more complex filters individually coupled to one of the switch mode power amplifiers, configured to suppress image components in the amplified and switched mixed product signals; and
a power combiner coupled to the two or more complex filters, configured to combine the real component of the complex filtered and amplified and switched mixed product signals to generate an RF transmission signal.

13. The power amplifier of claim 12, comprising an RF bandpass filter coupled to the output of the power combiner configured to further filter the RF transmission signal to a required spectral mask.

14. The power amplifier of claim 13, comprising an antenna coupled to RF bandbass filter.

15. The power amplifier of claim 12, wherein the power amplifier is configured for use in a base station conforming to UMTS standards.

16. The power amplifier of claim 12, wherein the baseband modulator comprises one of a pulse-width modulator and a delta-sigma modulator.

17. The power amplifier of claim 14, wherein the I/Q modulator comprises first and second mixers individually coupled to the baseband modulator and the voltage controlled oscillator, and wherein the first mixer is coupled to a first complex carrier signal and the second mixer is coupled to a second complex carrier signal.

18. The power amplifier of claim 17, wherein the I/Q modulator comprises a complex up-converter comprising first and second mixers individually coupled to the baseband modulator and the oscillator, and wherein the first mixer is coupled to a first complex carrier signal and the second mixer is coupled to a second complex carrier signal.

19. The power amplifier of claim 12, comprising two or more RF bandpass filters coupled to the output of the power combiner configured to further filter the RF transmission signal to a required spectral mask.

20. A power amplifier for a base station, comprising:
baseband modulation means operable to receive a baseband amplitude component and generate a baseband modulated pulse string;
phase modulation means operable to receive a baseband phase component and generate a phase modulated complex carrier signal; and
complex up-converter means operable to receive and mix the baseband modulated pulse string and the phase modulated complex carrier signal into a mixed product signal;
switching and amplifying means operable to amplify and switch the mixed product signal at a carrier frequency encoded within the mixed product signal;
complex filtering means operable to suppress image components in the amplified and switched mixed product signal; and
power combining means operable to combine the real component of the complex filtered and amplified and switched mixed product signal to generate an RF transmission signal.

21. The power amplifier of claim 20, wherein the baseband modulation means comprises a pulse width modulator and drive.

22. The power amplifier of claim 20, wherein the phase modulation means comprises a voltage controlled oscillator operable to receive the baseband phase component and generate first and second complex carrier signals.

23. The power amplifier of claim 20, wherein the complex up-converter means comprises first and second mixers individually coupled to the baseband modulation means and the phase modulation means, and wherein the first mixer is coupled to a first complex carrier signal and the second mixer is coupled to a second complex carrier signal.

24. A method for efficiently amplifying and modulating a complex carrier signal for a base station while suppressing image components in the desired RF frequency range employing baseband modulation, the method comprising:

receiving a baseband amplitude component and generating a baseband modulated pulse string;

receiving a baseband phase component and generating a phase modulated complex carrier signal; and up-converting the baseband modulated pulse string with the phase modulated complex carrier signal thereby generating a mixed product signal;

switching and amplifying the mixed product signal at a carrier frequency encoded within the mixed product signal;

complex filtering to suppress image components in the amplified and switched mixed product signal; and combining the real component of the complex filtered and amplified and switched mixed product signal to generate an RF transmission signal.

25. The method of claim 24, comprising filtering the RF transmission signal to a required spectral mask.

* * * * *